(12) United States Patent
Taylor

(10) Patent No.: US 7,541,867 B2
(45) Date of Patent: Jun. 2, 2009

(54) POLAR AMPLIFIER

(75) Inventor: Stewart S. Taylor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 75 days.

(21) Appl. No.: 11/807,997

(22) Filed: May 31, 2007

(65) Prior Publication Data
US 2008/0297246 A1    Dec. 4, 2008

(51) Int. Cl.
*H03F 3/20*    (2006.01)
(52) U.S. Cl. .......................... 330/136; 330/129
(58) Field of Classification Search ............. 330/136, 330/297; 323/282; 455/91, 108
See application file for complete search history.

(56) References Cited

U.S. PATENT DOCUMENTS

| | | | |
|---|---|---|---|
| 6,636,112 B1 | 10/2003 | McCune | |
| 6,690,233 B2 | 2/2004 | Sander | |
| 6,888,409 B1 | 5/2005 | Taylor | |
| 7,099,635 B2 | 8/2006 | McCune | |
| 7,116,946 B2 * | 10/2006 | Tanabe et al. | ......... 455/91 |
| 7,251,462 B2 * | 7/2007 | Matsuura et al. | ......... 455/108 |

OTHER PUBLICATIONS

International Search Report/Written Opinion for PCT Patent Application No. PCT/US2008/062813 mailed Jul. 23, 2008, 10 pgs.

* cited by examiner

*Primary Examiner*—Robert Pascal
*Assistant Examiner*—Hieu P Nguyen
(74) *Attorney, Agent, or Firm*—Dana B. Lemoine; Lemoine Patent Services, PLLC

(57) ABSTRACT

An amplifier circuit receives a phase modulated signal at an input node. The power supply terminal of the amplifier circuit is modulated in accordance with an amplitude envelope signal. The voltage on the power supply terminal is modulated using one or more linear regulators depending on the magnitude of the envelope signal.

15 Claims, 4 Drawing Sheets

POLAR AMPLIFIER

FIELD

The present invention relates generally to amplifier circuits, and more specifically to polar amplifier circuits.

BACKGROUND

Power amplifiers may be used to drive antennas in communications systems. For signals having a high dynamic range, the power amplifier may operate at low efficiency levels when the output signal is at less than full amplitude. If power amplifiers can be made more efficient at lower output power levels, energy consumption can be decreased resulting in longer battery life.

DESCRIPTION OF EMBODIMENTS

Figure 1:
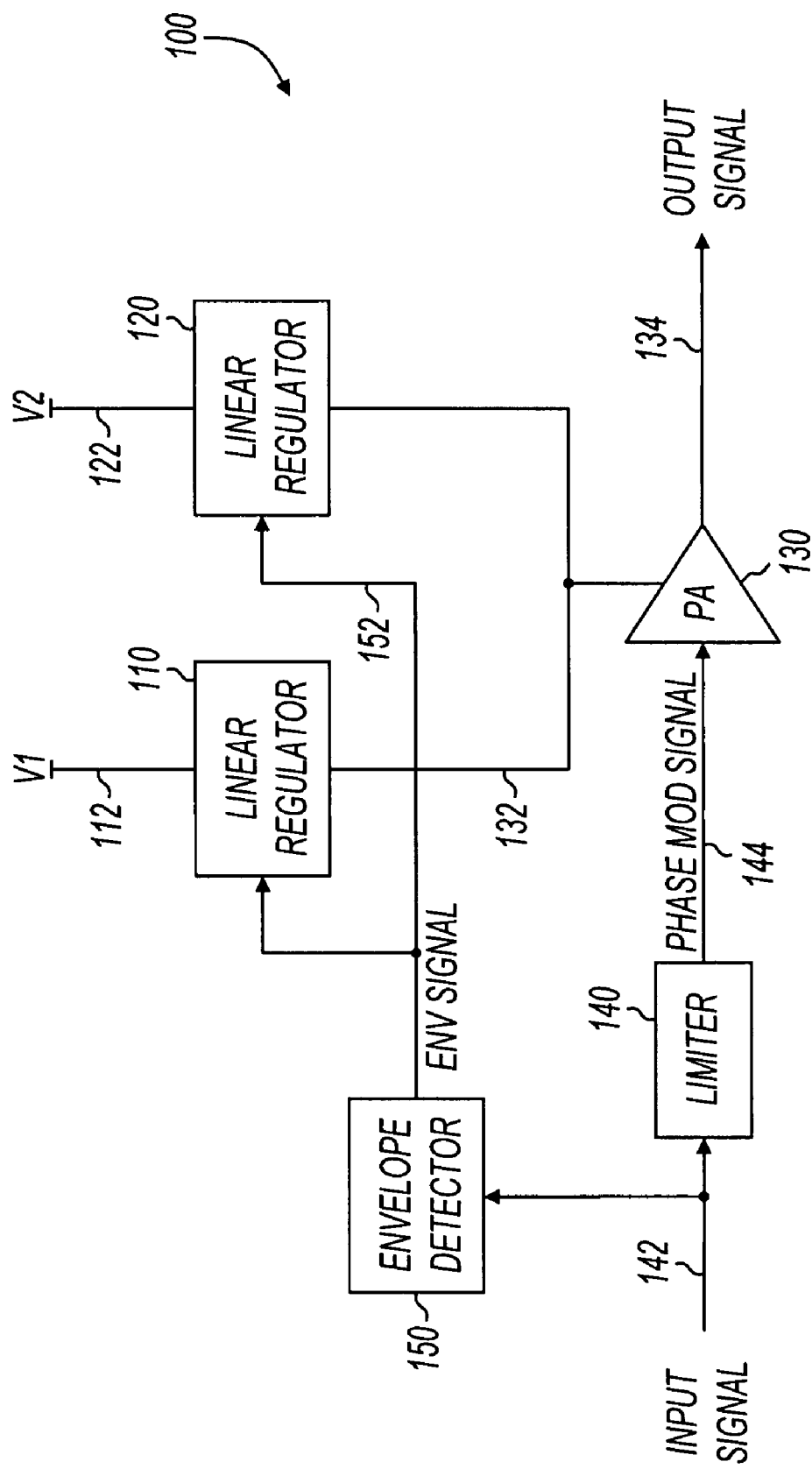
FIGS. 1 and 2 show amplifier circuits in accordance with various embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows an amplifier circuit in accordance with various embodiments of the present invention. Polar amplifier circuit 100 includes amplifier 130, limiter 140, envelope detector 150, and linear regulators 110 and 120.

Polar amplifier circuit 100 receives an input signal on node 142 having phase and amplitude modulation. Limiter 140 limits the amplitude of the input signal to produce a signal with a constant amplitude while preserving phase modulation on node 144. Envelope detector 142 detects the amplitude envelope of the input signal and produces an amplitude envelope signal on node 152. The frequency of the amplitude envelope signal is related to the modulation bandwidth of the input signal.

Amplifier 130 includes an input terminal coupled to node 144, an output terminal coupled to node 134, and a power supply terminal coupled to node 132. In some embodiments, amplifier 130 is a high efficiency nonlinear saturated amplifier. Amplifier 130 receives the phase modulated signal on node 144 and provides an amplified version on node 134. Since the phase modulated signal on node 144 has a substantially constant envelope, the amplitude of the output signal on node 134 is modulated in accordance with the modulation provided on power supply terminal 132.

Linear regulators modulate the voltage on power supply terminal 132 in response to the amplitude envelope signal. Linear regulator 110 is coupled between power supply node 112 and power supply terminal 132. Linear regulator 120 is coupled between power supply node 122 and power supply terminal 132. Power supply node 112 has a voltage V1, and power supply node 122 has a voltage V2. For the purposes of this description, we assume V1<V2.

Linear regulators 110 and 120 operate for different envelope magnitudes. For example, linear regulator 110 is coupled to the lower power supply voltage (V1) and operates as long as the voltage on power supply terminal 132 is below V1. When the voltage on the power supply terminal 132 increases beyond V1, linear regulator 110 turns off and linear regulator 120 turns on. Linear regulator 120 can bring the power supply terminal 132 up to substantially V2.

Overall amplifier efficiency is increased by operating from a lower power supply voltage (V1) when possible. For input signals with a high peak-to-average ratio, significant power savings can be achieved by operating from a lower power supply most of the time. The second linear regulator 120 operates from a higher power supply voltage to faithfully reproduce signal peaks, but is off most of the time. Accordingly, the DC power supplied to the power amplifier is reduced for the same peak output power capability, improving the power amplifier efficiency.

Figure 2:
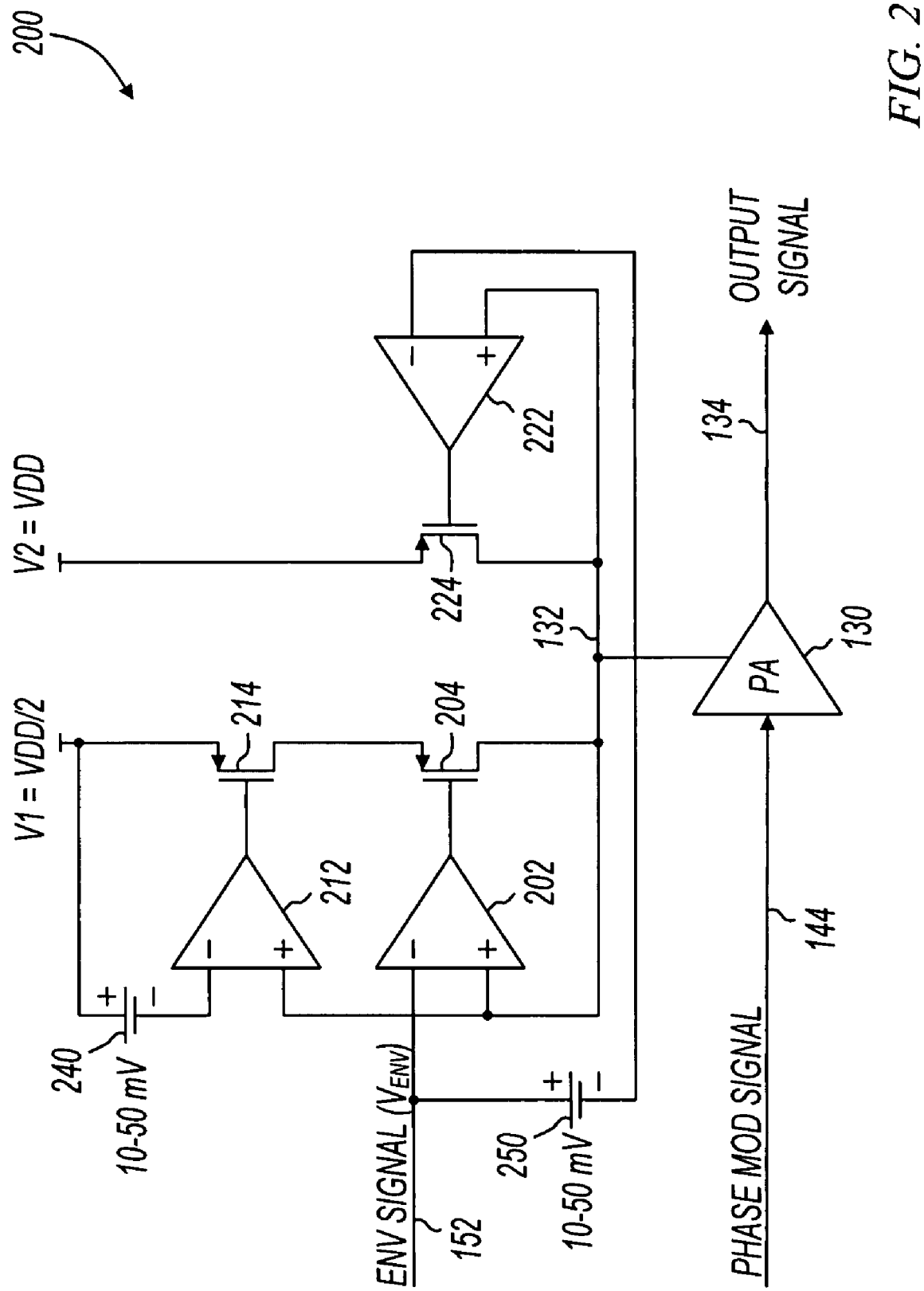

FIG. 2 shows an amplifier circuit in accordance with various embodiments of the present invention. Amplifier circuit 200 includes amplifier 130, a first linear regulator that includes control amplifier 202 and transistor 204, a second linear regulator that includes control amplifier 222 and transistor 224, an active rectifier that includes control amplifier 212 and transistor 214, and voltage offset circuits 240 and 250.

The transistors shown in FIG. 2 are p-channel metal oxide semiconductor (PMOS) transistors, but the invention is not limited to these transistor types. Any transistor type capable of performing the linear regulation as described herein may be utilized without departing from the scope of the present invention.

Amplifier circuit 200 receives an amplitude envelope signal ($V_{ENV}$) on node 152, and a phase modulated signal on node 144. In some embodiments, these signals are generated by limiting and envelope detecting a modulated input signal as described above with reference to FIG. 1. In other embodiments, these signals are generated using different methods. The mechanism(s) used to generate the envelope signal and phase modulated signal are not limitations of the present invention.

As described above with reference to FIG. 1, amplifier 130 is designed to operate in compression efficiently, and receives a phase modulated signal at its input. A first linear regulator includes transistor 204 and control amplifier 202. Transistor 204 and control amplifier 202 form a negative feedback loop such that the voltage delivered to node 132 by transistor 204 approximates the amplitude envelope signal ($V_{ENV}$) on node 152 when $V_{ENV}$ is less than V1. V1 is the smaller of two power supply voltages. For example, as shown in FIG. 2, in some embodiments V1 may be one half the value of power supply voltage source V2. Under this condition ($V_{ENV}$<V1), transistor 224 is off because control amplifier 222 makes the gate-to-source voltage of transistor 224 approximately 0V.

Additionally, transistor 214, control amplifier 212, and voltage offset circuit 240 form an active power rectifier for transistor 204. This active power rectifier connects transistor 204 to V1 when transistor 204 is operational (delivering power to amplifier 130), and disconnects transistor 204 when transistor 204 is not operational (when $V_{ENV}$ is greater than V1). When the voltage at node 132 is less than V1, control amplifier 212 drives transistor 214 such that transistor 214 is a switch connecting the source of transistor 204 to V1. When the voltage at node 132 is greater than V1, control amplifier 212 drives the gate of transistor 214 positive, making the gate-to-source voltage of transistor 214 approximately 0V, switching transistor 214 off. This occurs when $V_{ENV}$ is sufficiently large (greater than V1) such that control amplifier 222 and transistor 224 begin regulating the voltage at node 132. Voltages provided by voltage offset circuits 240 and 250 are chosen to overcome the offset voltage (and possibly limited gain) of control amplifiers 202, 222, and 212. In addition, voltage offset circuit 250 keeps transistor 224 off when $V_{ENV}$ is less than V1, and may be adjusted to create a dead zone between the operational ranges of the two linear regulators.

Many systems that utilize power amplifiers already have at least two power supplies provided by high-efficiency switching regulators. For example, a radio with digital circuitry may have power supplies that provide voltages of 3.3V and 1.65V. The 1.65V supply may be derived from the 3.3V supply. Accordingly, when utilized in these systems, the various embodiments of the present invention do not require additional components or board space to supply power to the power amplifier. The overall efficiency can be improved while using existing power supplies without requiring a separate switching regulator which adds cost and requires additional board space. In some embodiments, more than two linear regulators are used, and each linear regulator is coupled to a different power supply voltage.

Figure 3:
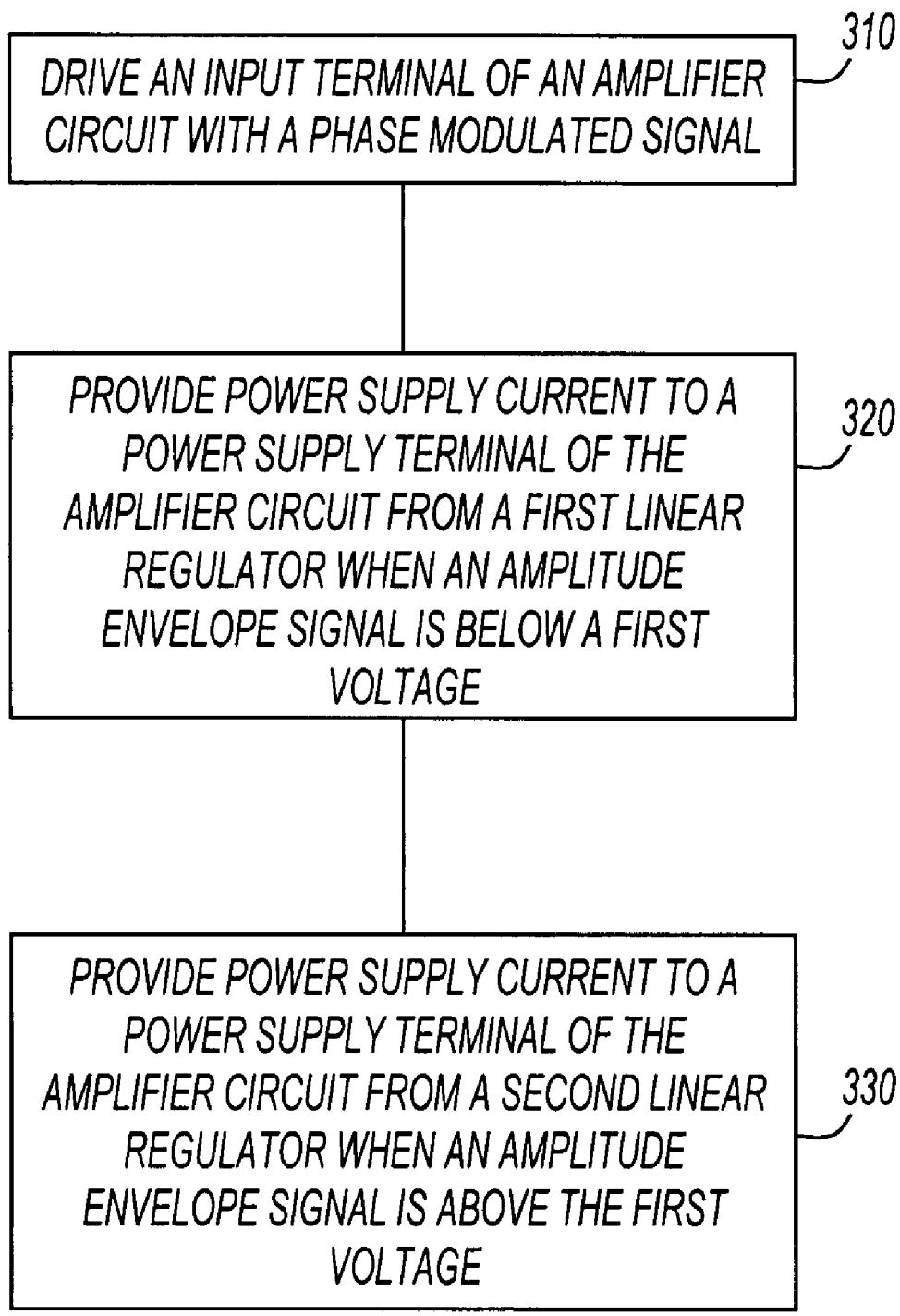
FIG. 3 shows a flowchart in accordance with various embodiments of the present invention.

FIG. 3 shows a flowchart in accordance with various embodiments of the present invention. In some embodiments, method 300, or portions thereof, is performed by a polar amplifier circuit, embodiments of which are shown in previous figures. In other embodiments, method 300 is performed by an integrated circuit or an electronic system. Method 300 is not limited by the particular type of apparatus performing the method. The various actions in method 300 may be performed in the order presented, or may be performed in a different order. Further, in some embodiments, some actions listed in FIG. 3 are omitted from method 300.

Method 300 is shown beginning with block 310 in which an input terminal of an amplifier circuit is driven with a phase modulated signal. For example, amplifier 130 (FIGS. 1, 2) may be driven with a phase modulated signal that is amplitude limited. The phase modulated signal may be generated using any means. At 310, power supply current is provided to a power supply terminal of the amplifier circuit from a first linear regulator when an amplitude envelope signal is below a first voltage. For example, when the amplitude envelope signal $V_{ENV}$ is below V1, linear regulator 110 (FIG. 1) or the linear regulator that includes control amplifier 202 and transistor 204 (FIG. 2) may provide power supply current to amplifier 130.

At 320, power supply current is provided to the power supply terminal of the amplifier circuit from a second linear regulator when the amplitude envelope signal is above the first voltage. For example, when the amplitude envelope signal $V_{ENV}$ is above V1, linear regulator 120 (FIG. 1) or the linear regulator that includes control amplifier 222 and transistor 224 (FIG. 2) may provide power supply current to amplifier 130.

The linear regulators provide a modulated power supply voltage to the amplifier circuit in response to the amplitude envelope signal. The amplifier circuit produces an output signal having the phase modulation of the input signal and amplitude modulation corresponding to the amplitude envelope signal.

Figure 4:
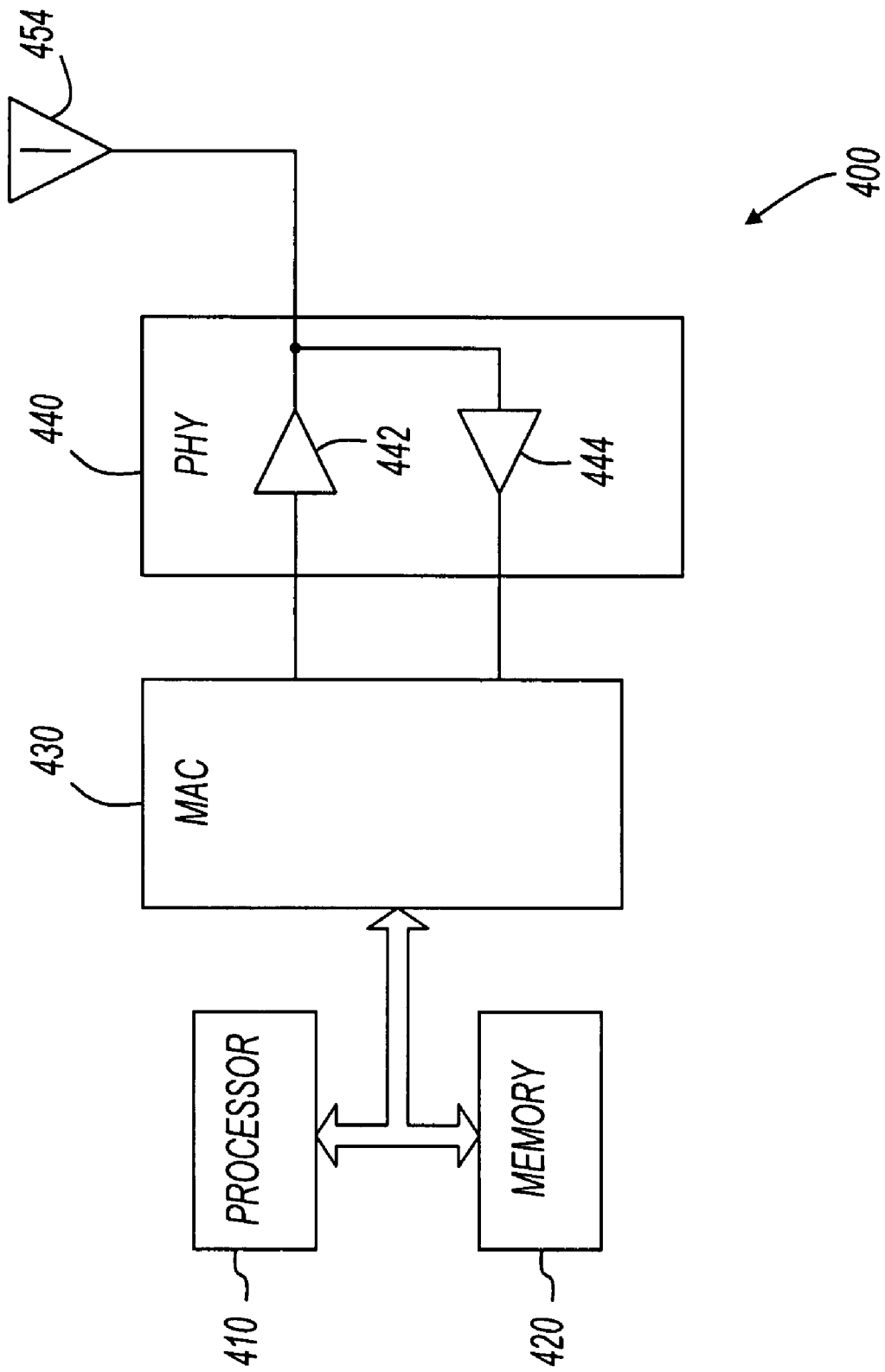
FIG. 4 shows a diagram of an electronic system in accordance with various embodiments of the present invention.

FIG. 4 shows a system diagram in accordance with various embodiments of the present invention. Electronic system 400 includes antenna 454, physical layer (PHY) 440, media access control (MAC) layer 430, processor 410, and memory 420. In operation, system 400 sends and receives signals using antenna 454, and the signals are processed by the various elements shown in FIG. 4.

Antenna 454 may include one or more antennas. For example, antenna 454 may include a single directional antenna or an omni-directional antenna. As used herein, the term omni-directional antenna refers to any antenna having a substantially uniform pattern in at least one plane. For example, in some embodiments, antenna 454 may include a single omni-directional antenna such as a dipole antenna, or a quarter wave antenna. Also for example, in some embodiments, antenna 454 may include a single directional antenna such as a patch antenna or a backfire antenna. In still further embodiments, antenna 454 may include multiple physical antennas. For example, in some embodiments, multiple antennas are utilized for multiple-input-multiple-output (MIMO) processing or spatial-division multiple access (SDMA) processing.

Physical layer (PHY) 440 is coupled to antenna 454 to interact with other wireless devices. PHY 440 may include circuitry to support the transmission and reception of radio frequency (RF) signals. For example, as shown in FIG. 4, PHY 440 includes power amplifier (PA) 442 and low noise amplifier (LNA) 444. Power amplifier 442 may include a amplifier such as those described above with reference to FIGS. 1 and 2. In some embodiments, PHY 440 includes additional functional blocks to perform filtering, frequency conversion or the like.

PHY 440 may be adapted to transmit/receive and modulate/demodulate signals of various formats and at various frequencies. For example, PHY 440 may be adapted to receive time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The various embodiments of the present invention are not limited in this regard.

Example systems represented by FIG. 4 include cellular phones, personal digital assistants, wireless local area network interfaces, wireless wide area network stations and subscriber units, and the like. Many other systems uses for power amplifiers exist. For example, PA 442 may be used in a desktop computer, a network bridge or router, or any other system without an antenna.

Media access control (MAC) layer 430 may be any suitable media access control layer implementation. For example, MAC 430 may be implemented in software, or hardware or any combination thereof. In some embodiments, a portion of MAC 430 may be implemented in hardware, and a portion may be implemented in software that is executed by processor 410. Further, MAC 430 may include a processor separate from processor 410.

Processor 410 may be any type of processor capable of communicating with memory 420, MAC 430, and other functional blocks (not shown). For example, processor 410 may be a microprocessor, digital signal processor (DSP), microcontroller, or the like.

Memory 420 represents an article that includes a machine readable medium. For example, memory 420 represents a random access memory (RAM), dynamic random access memory (DRAM), static random access memory (SRAM), read only memory (ROM), flash memory, or any other type of article that includes a medium readable by processor 410. Memory 420 may store instructions for performing software driven tasks. Memory 420 may also store data associated with the operation of system 400.

Although the various elements of system 400 are shown separate in FIG. 4, embodiments exist that combine the circuitry of processor 410, memory 420, MAC 430, and all or a portion of PHY 440 in a single integrated circuit. For example, MAC 430 and PA 442 may be combined together on an integrated circuit die. In some embodiments, the various elements of system 400 may be separately packaged and mounted on a common circuit board. In other embodiments, the various elements are separate integrated circuit dice packaged together, such as in a multi-chip module, and in still further embodiments, various elements are on the same integrated circuit die.

Amplifier circuits, linear regulator circuits, and other embodiments of the present invention can be implemented in many ways. In some embodiments, they are implemented in integrated circuits as part of electronic systems. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, portions of amplifier circuit 200 (FIG. 2) may be represented as polygons assigned to layers of an integrated circuit.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An apparatus comprising:
   an amplifier circuit having an input terminal, an output terminal, and a power supply terminal;
   a first linear regulator coupled between a first power supply node and the power supply terminal of the amplifier circuit; and
   a second linear regulator coupled between a second power supply node and the power supply terminal of the amplifier circuit;
   wherein the first and second linear regulators are coupled to be responsive to an amplitude envelope signal for amplification of a phase modulated signal present at the input terminal of the amplifier circuit, and wherein the first linear regulator includes a first control circuit to provide current from the first power supply node to the power supply terminal when a voltage on the power supply terminal is below a voltage on the first power supply node.

2. The apparatus of claim 1 wherein the first control circuit comprises:
   a first transistor coupled source-to-drain between the first power supply node and the power supply terminal; and
   a first control amplifier having an output node coupled to a gate of the first transistor, and input nodes coupled to receive a voltage on the power supply terminal and the amplitude envelope signal.

3. The apparatus of claim 1 wherein the second linear regulator includes a second control circuit to provide current from the second power supply node to the power supply terminal when a voltage on the power supply terminal is above the voltage on the first power supply node.

4. The apparatus of claim 3 wherein the second control circuit comprises:
   a second transistor coupled source-to-drain between the second power supply node and the power supply terminal; and
   a second control amplifier having an output node coupled to a gate of the second transistor, and input nodes coupled to receive the voltage on the power supply terminal and the amplitude envelope signal.

5. The apparatus of claim 1 further comprising an active rectifier to keep the first transistor from conducting when the voltage on the power supply terminal is above the voltage on the first power supply node.

6. An apparatus comprising:
   an amplifier coupled to receive a phase modulated component of an input signal; and
   a plurality of linear regulators coupled to source power supply current to a power supply terminal of the amplifier from different power supply voltages in response to an amplitude envelope component of the input signal;
   wherein the plurality of linear regulators comprises a first linear regulator to supply power supply current from a power supply node having a power supply voltage of V/2, and a second linear regulator to supply power supply current from a power supply node having a power supply voltage of substantially V, and wherein the second linear regulator is coupled to supply power supply current when a voltage on the power supply terminal is above V/2.

7. The apparatus of claim 6 wherein the first linear regulator comprises a first transistor coupled source-to-drain between the power supply node having a power supply voltage of V/2 and the power supply terminal of the amplifier.

8. The apparatus of claim 7 wherein the first linear regulator further comprises a first control amplifier coupled to regulate source-to-drain current in the first transistor in response to the amplitude envelope component of the input signal and a voltage on the power supply terminal of the amplifier.

9. The apparatus of claim 6 wherein the second linear regulator comprises a second transistor coupled source-to-drain between the power supply node having a power supply voltage of substantially V and the power supply terminal of the amplifier.

10. The apparatus of claim 9 wherein the second linear regulator further comprises a second control amplifier coupled to regulate source-to-drain current in the second transistor in response to the amplitude envelope component of the input signal and a voltage on the power supply terminal of the amplifier.

11. An apparatus comprising:
    an amplifier coupled to receive a phase modulated component of an input signal;
    a plurality of linear regulators coupled to source power supply current to a power supply terminal of the amplifier from different power supply voltages in response to an amplitude envelope component of the input signal, wherein the plurality of linear regulators comprises a first linear regulator to supply power supply current from a power supply node having a power supply voltage of V/2, and a second linear regulator to supply power supply current from a power supply node having a power supply voltage of substantially V; and a rectifier to turn off the first linear regulator when a voltage on the power supply terminal is above V/2.

12. The apparatus of claim 11 wherein the first linear regulator comprises a first transistor coupled source-to-drain between the power supply node having a power supply voltage of V/2 and the power supply terminal of the amplifier.

13. The apparatus of claim 12 wherein the first linear regulator further comprises a first control amplifier coupled to regulate source-to-drain current in the first transistor in response to the amplitude envelope component of the input signal and a voltage on the power supply terminal of the amplifier.

14. The apparatus of claim 11 wherein the second linear regulator comprises a second transistor coupled source-to-drain between the power supply node having a power supply voltage of substantially V and the power supply terminal of the amplifier.

15. The apparatus of claim 14 wherein the second linear regulator further comprises a second control amplifier coupled to regulate source-to-drain current in the second transistor in response to the amplitude envelope component of the input signal and a voltage on the power supply terminal of the amplifier.

* * * * *